(12) United States Patent
Lin et al.

(10) Patent No.: US 7,829,137 B2
(45) Date of Patent: Nov. 9, 2010

(54) FABRICATING DIELECTRIC LAYER

(75) Inventors: Wei-Ling Lin, Nantou County (TW); Pang Lin, Hsinchu (TW); Tarng-Shiang Hu, Hsinchu (TW); Liang-Xiang Chen, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 1041 days.

(21) Appl. No.: 11/308,387

(22) Filed: Mar. 21, 2006

(65) Prior Publication Data

US 2007/0172583 A1  Jul. 26, 2007

(30) Foreign Application Priority Data

Jan. 20, 2006  (TW) ............................... 95102236 A

(51) Int. Cl.
  *B05D 5/12*  (2006.01)
(52) U.S. Cl. .................................. 427/126.3; 427/126.4

(58) Field of Classification Search .............. 427/126.3, 427/126.4, 126.5, 126.6; 65/17.2
See application file for complete search history.

(56) References Cited

U.S. PATENT DOCUMENTS

| | | | | | |
|---|---|---|---|---|---|
| 4,170,672 | A | * | 10/1979 | Moriya et al. | 427/391 |
| 5,792,592 | A | * | 8/1998 | Uchida et al. | 430/313 |
| 5,858,462 | A | * | 1/1999 | Yamazaki | 427/226 |
| 6,586,791 | B1 | | 7/2003 | Lee et al. | 257/295 |

* cited by examiner

*Primary Examiner*—Roberts Culbert
(74) *Attorney, Agent, or Firm*—Jianq Chyun IP Office

(57) ABSTRACT

A composition for forming a dielectric layer includes a liquid organometallic compound serving as a precursor with high dielectric constant, a photo-sensitive polymer or a non-photo-sensitive polymer and a solvent, wherein the liquid organometallic compound includes metal alkoxide, and the metal of the metal alkoxide includes Al Ti, Zr, Ta, Si, Ba, Ge and Hf. The dielectric layer formed by the composition includes the photo-sensitive polymer or the non-photo-sensitive polymer and an amorphous metal oxide formed therein.

8 Claims, 1 Drawing Sheet

FABRICATING DIELECTRIC LAYER

CROSS-REFERENCE TO RELATED APPLICATION

This application claims the priority benefit of Taiwan application serial no. 95102236, filed on Jan. 20, 2006. All disclosure of the Taiwan application is incorporated herein by reference.

BACKGROUND OF THE INVENTION

1. Field of Invention

The present invention relates to a composition, material layer and method for forming the same used in field effect transistor (FET). More particularly, the present invention relates to a composition and a dielectric layer formed by the same and method for forming the dielectric layer.

2. Description of Related Art

For the semiconductor carrier transmission of the field effect transistor, a voltage is applied to the gate, and sufficient induced charges are formed at the interface between the semiconductor and the gate dielectric layer so as to promote the carrier transmission. In order to that the FET has a high current ID in low voltage operation, capacitance is also involved in addition to the carrier mobility and the channel length between the source and drain electrodes. The thinner the thickness of the film of the dielectric layer is and the higher the dielectric constant is, and the higher the capacitance is.

3M company provides a dielectric layer with high dielectric constant in U.S. Pat. No. 6,586,791, wherein the gate dielectric layer is formed by coating the suspended solution formed by mixing the nanometer ceramic powder into polymer material. However, stripes may be formed on the surface of the dielectric layer made by the method, and therefore, the roughness of the surface is worse, so that leakage path is easily formed to generate a high leakage current.

SUMMARY OF THE INVENTION

Accordingly, the present invention is to provide a dielectric layer having high dielectric constant, low leakage current, high uniformity, and high surface roughness.

The present invention is to provide a method for fabricating a dielectric layer with high dielectric constant, low leakage current, and the fabricating process is simple with low cost, and the fabricating process can be operated in low temperature.

The present invention is to provide a composition for forming a dielectric layer, and the composition is at homogeneous phase with low cost, and the composition can form the dielectric layer with high dielectric constant, low leakage current using simple fabricating process in low temperature.

The present invention provides a composition for forming a dielectric layer, and the composition includes a liquid organometallic compound serving as precursor with high dielectric constant, a solvent and a photo-sensitive polymer or a non-photo-sensitive polymer.

According to the embodiment of the present invention, the liquid organometallic compound includes metal alkoxide, wherein the metal includes Al, Ti, Zr, Ta, Si, Ba, Ge or Hf. The photo-sensitive polymer or the non-photo-sensitive polymer includes polyimide, polyamide, polyvinylalcohol, polyvinylphenol, polyacrylate, epoxy, polyurethane, fluoropolymer, polysiloxane, polyester, polyacrylonitrile, polystyrene, or polyethylene.

The present invention provides a manufacturing method for forming the dielectric layer. The composition is formed on a substrate. Next, a baking process is performed to remove the solvent, so that the metal in the organometallic compound converts to metal oxide.

According to the embodiment, the baking process includes a soft baking process and a hard baking process. The soft baking process is performed at 0° C.-150° C., or room temperature-100° C., or room temperature-80° C. The hard baking process is performed at 0° C.-300° C., or room temperature-200° C., or room temperature-150° C.

The present invention provides a dielectric layer. The dielectric layer includes a photo-sensitive polymer or a non-photo-sensitive polymer and an amorphous metal oxide in the photo-sensitive polymer or the non-photo-sensitive polymer.

According to the embodiment of the present invention, the amorphous metal oxide includes metal oxide, and the metal includes Al, Ti, Zr, Ta, Si, Ba, Ge or Hf. The photo-sensitive polymer or non-photo-sensitive polymer includes polyimide, polyamide, polyvinylalcohol, polyvinylphenol, polyacrylate, epoxy, polyurethane, fluoropolymer, polysiloxane, polyester, polyacrylonitrile, polystyrene, or polyethylene. The dielectric layer can be used as a gate dielectric layer of a field effect transistor and a thin film transistor or the dielectric layer of a capacitor, or the dielectric layer can be applied in high frequency devices.

The dielectric layer of the present invention comprises the photo-sensitive polymer or the non-photo-sensitive polymer and the amorphous metal oxide formed therein. The metal oxide is at amorphous phase, rather than crystal phrase, and the dielectric constant is high, so that the metal oxide can improve the entire dielectric constant of the dielectric layer. In addition, as the metal oxide is formed by baking the homogeneous phase composition, compared to the dielectric layer made by the suspended solution formed by mixing the crystal metal oxide powder into polymer, the film uniformity of the composition of the present invention is better, and the metal oxide is arranged in the formed composition with better uniformity, and the composition also has better solvent resistance. Therefore, the dielectric layer of the present invention can be applied in the gate dielectric layers of a field effect transistors and a thin film transistor, the dielectric layer between the two electrodes in the capacitor, and even applied in the high frequency devices, and the formed device has features such as high breakdown voltage, high aperture rate and low power consumption.

In addition, since the dielectric layer can be formed in low temperature, the dielectric layer can be applied in flexible substrate.

In order to the make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The dielectric layer of the present invention is formed by baking a liquid composition. The liquid composition includes a photo-sensitive polymer or a non-photo-sensitive polymer, an organometallic compound and a solvent. The photo-sensitive polymer or non-photo-sensitive polymer includes polyimide, polyamide, polyvinylalcohol, polyvinylphenol, polyacrylate, epoxy, polyurethane, fluoropolymer, polysiloxane, polyester, polyacrylonitrile, polystyrene, or polyethylene.

The organometallic compound is a liquid metal alkoxide, and the structure is:

$M(OR)_n$ wherein, M includes Al, Ti, Zr, Ta, Si, Ba, Ge and Hf; OR is an alkoxy with 1-10 carbons, such as methoxy, ethoxy, propoxy, isopropoxy, butoxy, isobutoxy, pentyloxy, hexyloxy, heptyloxy, octyloxy, nonyloxy, decyloxy, 2-methyl-nonyloxy, 3-methyl-nonyloxy, 4-methyl-nonyloxy, 5-methyl-nonyloxy, 3-ethyl-octyloxy, 4-ethyl-octyloxy, 4-propyl-heptyloxy, 4-isopropyl-heptyloxy, 2-methyl-octyloxy, 3-methyl-octyloxy, 4-methyl-octyloxy, 3-ethyl-heptyloxy, 4-ethyl-heptyloxy, 2-methyl-heptyloxy, 3-methyl-heptyloxy, 4-methyl-heptyloxy, 3-ethyl-hexyloxy, 2-methyl-hexyloxy, 3-methyl-hexyloxy, 3-ethyl-pentyloxy, 2-methyl-pentyloxy, 3-methyl-pentyloxy, 2-methyl-propoxy, 2-methoxy-3-ethoxy, etc.; and n is 1-5.

When the organometallic compound is an aluminum alkoxide, the embodiment thereof includes $Al(OCH_2CH_2OCH_3)_3$. When the organometallic compound is a titanium alkoxide, the embodiment thereof includes $Ti(OC_4H_9)_4$. When the organometallic compound is a zirconium alkoxide, the embodiment thereof includes $Zr(OC_8H_{17})_4$. When the organometallic compound is a tantalum alkoxide, the embodiment thereof includes $Ta(OC_2H_5)_5$. When the organometallic compound is a silicon alkoxide, the embodiment thereof includes $Si(OCH_3)_4$. When the organometallic compound is a barium alkoxide, the embodiment thereof includes $Ba(OC_4H_9)_2$. When the organometallic compound is a hafnium alkoxide, the embodiment thereof includes $Hf(OC_8H_{17})_4$. When the organometallic compound is a germanium alkoxide, the embodiment thereof includes $Ge(OC_2H_5)_4$.

The solvent in the composition of the present invention is used to dissolve the photo-sensitive polymer or non-photo-sensitive polymer to form a homogeneous phase liquid with the organometallic compound. The solvent includes, for example, water, methanol, ethanol, isopropanol, butanol, tetrahydrofuran, formamide, N-methylpyrrolidone (NMP), N,N-dimethylacetamide (DMAc), N,N-dimethylformamide (DMF), dimethyl sulfoxide (DMSO), r-butyrolactone, 1,3-dimethyl-2-imidizolidinone (DMI).

The composition of the present invention can be used to form the gate dielectric layer of the transistor, and the following will describe the composition through the embodiment.

Figure 1:
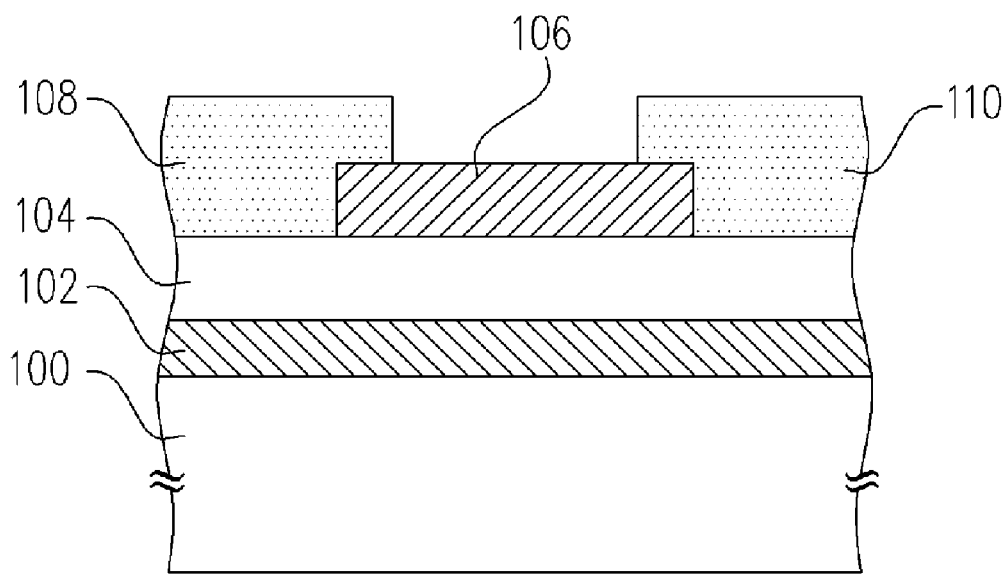
FIG. 1 is a schematic diagram of the transistor with top contact structure according to the present invention.
Figure 2:
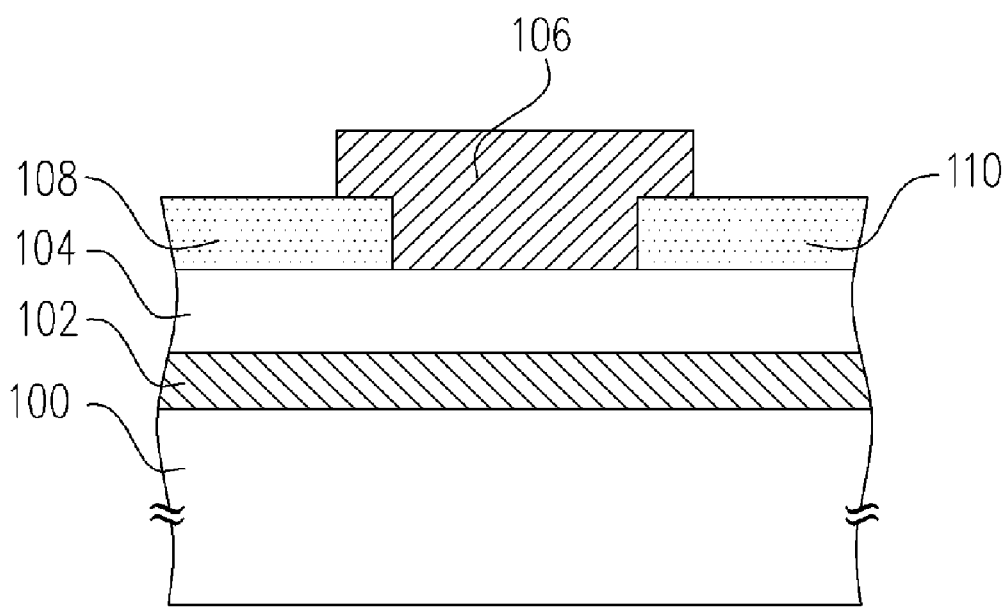
FIG. 2 is a schematic diagram of the transistor with bottom contact structure according to the present invention.

FIG. 1 is a schematic diagram of the transistor with top contact structure according to the present invention. FIG. 2 is a schematic diagram of the transistor with bottom contact structure according to the present invention.

Referring to FIG. 1 and FIG. 2, a gate 102 is formed on a substrate 100. Then, the composition of the present invention is formed on the electrode 102. The substrate 100 is, for example, a rigid substrate such as glass substrate or silicon wafer, or a flexible substrate. The material of the gate 102 is, for example, indium tin oxide (ITO). Then, a hard baking process and a soft baking process are performed in sequence to remove the solvent in the composition, so that the metal in the organometallic compound convert to metal oxide so as to form the gate dielectric layer 104.

The composition of the present invention can be formed on the substrate 100 using direct patterning. Alternatively, the composition can be first coated on the substrate 100, and a patterning process is performed after the baking process. The method of direct patterning includes, for example, slot die coating, flexographic coating, inkjet printing, microcontact printing, nanoimprinting, and screen printing. The method of coating includes, for example, spin coating, dip coating, and spray. The method of patterning includes, for example, photolithography, etching, and laser ablation. The baking process includes a soft baking process in low temperature and a hard baking process in higher temperature. The temperatures of the soft baking process and the hard baking process are related to the kind of the solvent in the composition. The temperature of soft baking process may be 0° C.-150° C., and the preferred is room temperature-100° C., and the more preferred is room temperature-80° C. The temperature of hard baking process may be 0° C.-300° C., and the preferred is room temperature-200° C., and the more preferred is room temperature-150° C.

Next, a patterned semiconducting layer 106, a source 108 and a drain 110 are formed, so as to complete the transistor with the top contact structure as shown in FIG. 1, or the transistor with the bottom contact structure as shown in FIG. 2.

The composition of the present invention can be used to fabricate the gate dielectric layer of the field effect transistor and the thin film transistor and can also be used to fabricate the dielectric layer of a capacitor, or the composition of the present invention can also be applied in high frequency devices.

The First Embodiment

Referring to FIG. 1, the composition, formed by mixing the 20 wt. % $Ta(OC_2H_5)_4$, 6 wt. % polyimide and N-methylpyrrolidone (NMP) or r-butyrolactone, is spin coated on the glass substrate with bottom electrode of ITO thereon by speed of 400 rpm/10 s and 1000 rpm/30 s, so as to form a thin film. Next, the thin film is performed a soft baking process on the hart plate at 80° C., then, the thin film is performed a hard baking process in an oven at 150° C. to form a gate dielectric layer. Thereafter, a patterned semiconducting layer, a source and a drain are formed, so as to complete a transistor with top contact structure. Thereafter, I-V and C-V characteristics of the transistor are measured. The dielectric constant is 5.7. The mobility is 0.047 cm$^2$/Vs. The on/off ratio is $10^4$-$10^5$.

The Second Embodiment

The transistor with top contact structure is formed according to the aforementioned method, besides, the composition is changed to the compound formed by 30 wt. % $Ta_2(acac)_5$, 6 wt. % polyimide and N-methylpyrrolidone (NMP) or r-butyrolactone. I-V and C-V characteristics of the transistor are measured. The dielectric constant is 6.7. The mobility μ is 0.059 cm$^2$/Vs. The on/off ratio is $10^4$.

The organometallic compound in the aforementioned composition is described by the example of tantalum alkoxide. The other metal alkoxide of the present invention can also form the composition using the methods similar to the first or second embodiment, wherein the metal includes Al, Ti, Zr, Ta, Si, Ba, Ge or Hf, and, after baking the formed composition, the dielectric layer can be formed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a dielectric layer, comprising:
   forming a composition on a substrate, and the composition comprising:
   a liquid organometallic compound, serving as a precursor with high dielectric constant;
   a photo-sensitive polymer or a non-photo-sensitive polymer comprising polyimide, polyamide, polyvinylalcohol, polyvinylphenol, epoxy, polyurethane, fluoropolymer, polysiloxane, polyacrylonitrile, polystyrene, or polyethylene; and
   a solvent; and
   performing a baking process comprising a soft baking process and a hard baking process to remove the solvent, so that the metal in the organometallic compound convert to metal oxide,
   wherein the composition is formed on the substrate directly followed by the soft baking process and the soft baking process is performed directly followed by the hard baking process.

2. The method of fabricating a dielectric layer of claim 1, wherein the organometallic compound includes metal alkoxide, and the metal of the metal alkoxide includes Al, Ti, Zr, Ta, Si, Ba, Ge and Hf.

3. The method of fabricating a dielectric layer of claim 1, wherein the soft baking process is performed at 0° C.-150° C.

4. The method of fabricating a dielectric layer of claim 3, wherein the soft baking process is performed at room temperature-100° C.

5. The method of fabricating a dielectric layer of claim 4, wherein the soft baking process is performed room temperature-80° C.

6. The method of fabricating a dielectric layer of claim 1, wherein the hard baking process is performed at 0° C.-300° C.

7. The method of fabricating a dielectric layer of claim 6, wherein the hard baking process is performed at room temperature-200° C.

8. The method of fabricating a dielectric layer of claim 7, wherein the hard baking process is performed at room temperature-150° C.

* * * * *